(12) United States Patent
Kim et al.

(10) Patent No.: US 8,552,639 B2
(45) Date of Patent: Oct. 8, 2013

(54) WHITE ORGANIC LIGHT EMITTING DEVICE

(75) Inventors: Mu-gyeom Kim, Yongin-si (KR);
Sang-yeol Kim, Yongin-si (KR);
Sung-hoon Lee, Yongin-si (KR);
Jung-bae Song, Yongin-si (KR)

(73) Assignee: Samsung Display Co., Ltd.,
Giheung-Gu, Yongin, Gyeonggi-Do (KR)

( * ) Notice: Subject to any disclaimer, the term of this patent is extended or adjusted under 35 U.S.C. 154(b) by 1049 days.

(21) Appl. No.: 12/292,848

(22) Filed: Nov. 26, 2008

(65) Prior Publication Data

US 2009/0146560 A1    Jun. 11, 2009

(30) Foreign Application Priority Data

Nov. 30, 2007  (KR) .................. 10-2007-0123821
May 27, 2008   (KR) .................. 10-2008-0049272

(51) Int. Cl.
*H01L 51/50* (2006.01)

(52) U.S. Cl.
USPC .......................................... 313/506; 313/504

(58) Field of Classification Search
USPC ............................................ 313/504
See application file for complete search history.

(56) References Cited

U.S. PATENT DOCUMENTS

| 6,362,566 B2* | 3/2002 | Xu et al. .................. 313/501 |
| 2005/0073228 A1* | 4/2005 | Tyan et al. ................ 313/110 |
| 2005/0260439 A1* | 11/2005 | Shiang et al. .............. 428/690 |
| 2006/0142520 A1* | 6/2006 | Jones et al. ............... 526/328.5 |
| 2006/0228577 A1* | 10/2006 | Nagara .................... 428/690 |

* cited by examiner

*Primary Examiner* — Britt D Hanley
(74) *Attorney, Agent, or Firm* — Robert E. Bushnell, Esq.

(57) ABSTRACT

A white organic light emitting device (WOLED) includes electroluminescence (EL) red and blue light emitting layers disposed inside a cavity and a non-electroluminescence (NEL) green light emitting unit disposed outside the cavity or on a region inside the cavity where there are no combinations of electrons and holes. The green light emitting unit adjusts a green spectrum by resonating greenish blue light in the cavity, or is disposed on a path through which red and blue light output from the cavity travels and adapted to absorb the blue light and emit green light. A photoluminescence (PL) light emitting layer may be a capping layer covering the cavity. The capping layer functions as an optical path control layer controlling an optical path. A white spectrum is obtained by combining blue light and red light generated by EL and green generated by PL. This WOLED can operate at a low voltage.

13 Claims, 7 Drawing Sheets
(2 of 7 Drawing Sheet(s) Filed in Color)

WHITE ORGANIC LIGHT EMITTING DEVICE

CLAIM OF PRIORITY

This application makes reference to, incorporates the same herein, and claims all benefits accruing under 35 U.S.C. §119 from an application earlier filed in the Korean Intellectual Property Office on 30 Nov. 2007 and 27 May 2008, and there duly assigned Serial No. 10-2007-0123821 and 10-2008-0049272, respectively.

BACKGROUND OF THE INVENTION

1. Field of the Invention

The present invention relates to a white organic light emitting device (WOLED), and more particularly, to a voltage-driven WOLED using electroluminescence and photoluminescence.

2. Description of the Related Art

In general, organic light emitting devices (OLEDs) are spontaneous emission devices. The spontaneous emission devices emit light induced by combinations of electrons and holes. OLEDs have the advantages of higher color reproducibility, faster response speed, smaller thickness, higher contrast ratio, wider viewing angle, and lower power consumption. Such OLEDs may be used in various fields such as display devices and illumination devices.

A white organic light emitting device (WOLED), which is a thin light source using an open mask instead of a high definition mask, is advantageous of higher resolution and larger scale, and can be used in a backlight of a liquid crystal display (LCD) device or a full color display device employing a color filter. In order to increase the luminous efficiency of the WOLED, research has been made on a stacked structure, in which red (R), green (G), and blue (B) light emitting layers are vertically connected in series. Since the light emitting layers require voltages and are connected in series, the voltage applied to the entire stacked structure, that is, a driving voltage, may be very high. When the high driving voltage is applied to the stacked structure, electricity charges of the light emitting layers are disadvantageously forced to be unbalanced to change the distribution of luminous intensity. The changed distribution of luminous intensity may change color coordinates, and thus the desired white color coordinates is difficult to be achieved. Here, the color coordinate is a group of parameters for defining a certain color in a chromaticity diagram, and the parameters may be, for example, hue and saturation.

The main objective of the WOLED is to realize white light having color coordinates (0.31, 0.31). A top emission type WOLED has a structure in which a reflective layer is disposed under an emission structure having a thickness of about 100 nm to about 200 nm, and white light is emitted through an upper portion of the emission structure. An optical path control layer (OPCL) for effectively extracting desired light from a spectrum changed by a cavity is disposed on the emission structure through which the white light is emitted.

Therefore, the major disadvantages of the contemporary WOLED are high driving voltage and the disadvantageous color shift induced by the high driving voltage.

SUMMARY OF THE INVENTION

It is therefore, an object of the present invention to provide a white organic light emitting device (WOLED) that can reduce the disadvantageous color change and can operate under a lower driving voltage and lower driving current.

It is another object of the present invention to provide a voltage-driven WOLED using electroluminescence and photoluminescence.

According to an exemplary embodiment of the present invention, a white organic light emitting device (WOLED) includes an electroluminescence (EL) light emitting unit including a first light emitting layer and a second light emitting layer which emit light using combinations of electrons and holes; and a non-electroluminescence (NEL) light emitting unit generating a third light having a wavelength different from light emitted by the first light emitting layer and the second light emitting layer by using light emitted by the EL light emitting unit.

According to exemplary embodiments of the present invention, the NEL light emitting unit may further include a first electrode and a second electrode which define an optical cavity in which the electroluminescence (EL) light emitting unit is disposed.

According to an exemplary embodiment of the present invention, the EL light emitting unit may generate the third light by using a resonance structure between the first electrode and the second electrode. The NEL light emitting unit may include a photoluminescence (PL) light emitting unit disposed on a path through which light output from the EL light emitting unit travels, and adapted to absorb part of the light output from the EL light emitting unit and to emit the third light. Photoluminescence (PL) refers to an optical phenomenon in which a substance absorbs photons (electromagnetic radiation) and then re-radiates photons. Electroluminescence (EL) is an optical phenomenon and electrical phenomenon in which a material emits light in response to an electric current passed through it, or in response to a strong electric field.

According to another exemplary embodiment of the present invention, the WOLED may further having functional layers disposed on both sides of the electroluminescence (EL) light emitting unit, and injecting and transporting electrons and holes supplied from the first electrode and the second electrode.

According to another exemplary embodiment of the present invention, the first and second light emitting layers may respectively emit blue light and red light, and the NEL light emitting unit may generate green light.

According to another exemplary embodiment of the present invention, the photoluminescence (PL) light emitting unit disposed on the path through which light output from the EL light emitting unit travels, may be disposed outside of the cavity.

According to another exemplary embodiment of the present invention, the WOLED may further include an optical path control layer (OPCL) disposed outside of the cavity, doped with a photoluminescence (PL) material, and controlling a spectrum of output light.

According to another exemplary embodiment of the present invention, the EL light emitting unit and the photoluminescence (PL) light emitting unit may be disposed inside of the cavity, wherein the photoluminescence (PL) light emitting unit is disposed on a portion of the path through which light output from the EL light emitting unit travels, where there are no combinations of electrons and holes.

According to another exemplary embodiment of the present invention, the WOLED may further include functional layers disposed on both sides of the EL light emitting unit, doped with a photoluminescence (PL) material on the path through which light output from the EL light emitting unit travels, and injecting and transporting electrons and holes supplied from the first electrode and the second electrode.

According to another exemplary embodiment of the present invention, the functional layers may include at least one selected from the group consisting of a hole injection layer, a hole transport layer, an electron injection layer, an electron transport layer, a hole blocking layer, and an electron blocking layer.

According to another exemplary embodiment of the present invention, the hole transport layer may include a fast hole transport layer and a slow hole transport layer.

According to another exemplary embodiment of the present invention, the WOLED may further include a charge balancing layer disposed between the first light emitting layer and the second light emitting layer.

According to another exemplary embodiment of the present invention, the light emitting units include either phosphorescent material or fluorescent material.

The patent or application file contains at least one drawing executed in color. Copies of this patent or patent application publication with color drawing(s) will be provided by the Office upon request and payment of the necessary fee.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
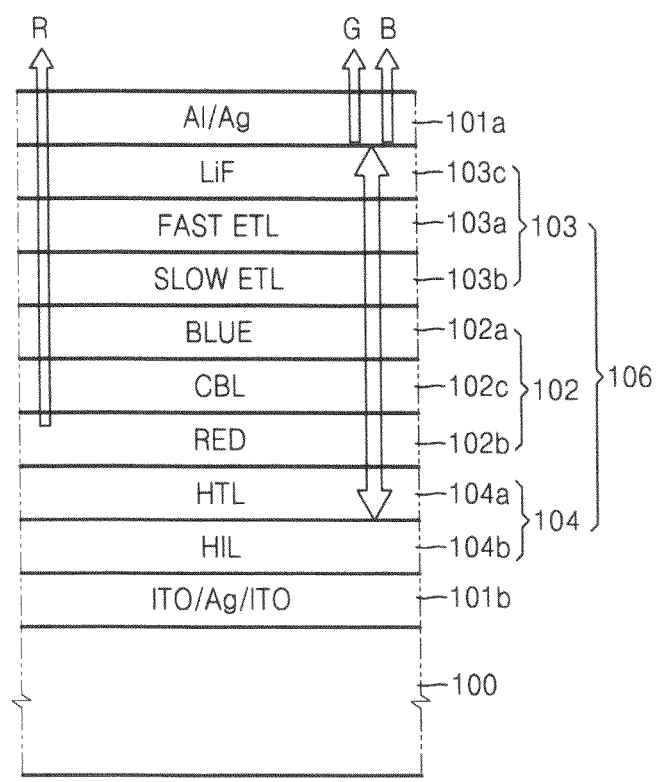
FIG. 1 is a cross-sectional schematic view of a white organic light emitting device (WOLED) constructed as an embodiment of the present invention.

The invention is described more fully hereinafter with reference to the accompanying drawings, in which embodiments of the invention are shown. This should not be construed as limiting the claims to the embodiments shown. Rather, these embodiments are provided to convey the scope of the invention to those skilled in the art. In the drawings, the size and relative sizes of elements and regions may be exaggerated for clarity.

It will be understood that when an element or layer is referred to as being "on", "interposed", "disposed", or "between" another element or layer, it can be directly on, interposed, disposed, or between the other element or layer or intervening elements or layers may be present.

The terms "first," "second," and the like, "primary," "secondary," and the like, as used herein do not denote any order, quantity, or importance, but rather are used to distinguish one element, region, component, layer, or section from another. The terms "front", "back", "bottom", and/or "top" are used herein, unless otherwise noted, merely for convenience of description, and are not limited to any one position or spatial orientation.

The terms "a" and "an" do not denote a limitation of quantity, but rather denote the presence of at least one of the referenced item. The suffix "(s)" as used herein is intended to include both the singular and the plural of the term that it modifies, thereby comprising one or more of that term (e.g., the layer(s) includes one or more layers).

Reference throughout the specification to "one embodiment", "another embodiment", "an embodiment", and so forth, means that a particular element (e.g., feature, structure, and/or characteristic) described in connection with the embodiment is included in at least one embodiment described herein, and may or may not be present in other embodiments. In addition, it is to be understood that the described elements may be combined in any suitable manner in the various embodiments.

The endpoints of all ranges directed to the same component or property are inclusive of the endpoint and independently combinable, e.g., ranges of "up to about 25 wt. %, or, more specifically, about 5 wt. % to about 20 wt. %," is inclusive of the endpoints and all intermediate values of the ranges of "about 5 wt. % to about 25 wt. %," etc. The modifier "about" used in connection with a quantity is inclusive of the stated value and has the meaning dictated by the context (e.g., includes the degree of error associated with measurement of the particular quantity).

Unless defined otherwise, technical and scientific terms used herein have the same meaning as is commonly understood by one of skill in the art to which this invention belongs.

FIG. 1 is a schematic cross-sectional view of a top emission type white organic light emitting device (WOLED) constructed as an embodiment of the present invention.

Referring to FIG. 1, a transparent first electrode 101a and a reflective second electrode 101b define an internal optical cavity having a gap of approximately 100 nm or less. The internal cavity is a strong cavity formed by the first electrode 101a having a low transmittance, for example, a transmittance of 70%, and the second electrode 101b having a reflectance of 100%. The first electrode 101a may have a stacked structure in which an aluminum (Al) layer, a silver (Ag) layer, and a magnesium (Mg) layer are stacked. Since the strong cavity 106, which defines a non-electroluminescence (NEL) light emitting unit, adjusts a green spectrum by resonating light, for example, greenish blue light, obtained from electronluminescence (EL), green light necessarily used for achieving the white light may therefore be obtained.

A first light emitting layer 102a and a second light emitting layer 102b of an electronluminescence (EL) light emitting unit 102 disposed in strong cavity generate light of different wavelengths, and are formed of an organic phosphorescent or fluorescent material. For example, the first light emitting layer 102a may generate blue light and the second light emitting layer 102b may generate red light, or vice versa. A charge balancing layer (CBL) 102c for balancing charges of the first light emitting layer 102a and the second light emitting layer 102b is disposed between the first light emitting layer 102a and the second light emitting layer 102b. Charge balancing layer (CBL) 102c has a lowest unoccupied molecular orbital (LUMO) level of higher than 2.5 eV and a highest occupied molecular orbital (HOMO) level of less than 5.5 eV. For example, charge balancing layer 102c may be formed of an electron transport material or a hole transport material. Charge balancing layer 102c is optional, and accordingly, the first light emitting layer 102a and the second light emitting layer 102b may directly contact each other without charge balancing layer 102c therebetween.

First and second functional layers 103 and 104 for injecting and transporting electrons and holes supplied from the first electrode 101a and the second electrode 101b are respectively disposed on both sides of electronluminescence (EL) light emitting unit 102. A resonance of the light generated from EL light emitting unit 102 occurs between the first and second functional layers 103 and 104.

The first functional layer 103 may be an electron transport layer (ETL), and may have a single-layer or multi-layer structure. When the first functional layer 103, that is, ETL, has a multi-layer structure, the first functional layer 103 may include a fast ETL 103a and slow ETL 103b. The first functional layer 103 may further include an electron injection layer (EIL) 103c formed of a well-known material such as LiF. Fast ETL 103a and slow ETL 103b used to achieve high efficiency respectively have a mobility of higher than $10^{-5}$ cm$^2$/Vs and a mobility of less than $10^{-6}$ cm$^2$/Vs so that the mobility of fast ETL 103a is ten or more times faster than that of slow ETL 103b. Since the first functional layer 103 includes fast ETL 103a and slow ETL 103b, electrons are accumulated on an interface between fast ETL 103a and slow ETL 103b according to a difference of the drift velocity of electrons between fast ETL 103a and slow ETL 103b, and thus holes may be effectively induced and combined with the electrons.

The second functional layer 104 may include a hole transport layer (HTL) 104a and a hole injection layer (HIL) 104b. The second functional layer 104 injects and transports holes into electronluminescence (EL) light emitting unit 102. The function of the second functional layer 104b may be exchanged with that of the first functional layer 104a. The entire stacked structure may be formed on a substrate 100. Since the second electrode 101b is a reflective layer, light emitted by electronluminescence (EL) light emitting unit 102, for example, blue light B and red light R inside the cavity, partially passes through the first electrode 101a and is output to the exterior.

Figure 2:
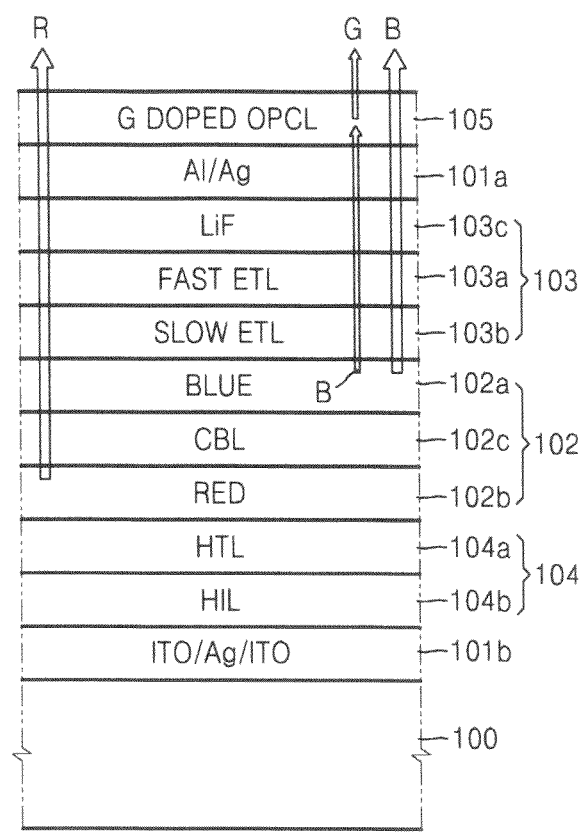
FIG. 2 is a cross-sectional schematic view of a WOLED constructed as another embodiment of the present invention.

FIG. 2 is a schematic cross-sectional view of a WOLED constructed as another embodiment of the present invention. Referring to FIG. 2, an optical path control layer (OPCL) 105 which is a capping layer for controlling a spectrum of output light is disposed on a first electrode 101a'. OPCL 105, which is a photoluminescence (PL) light emitting unit that is a type of NEL light emitting unit, has a thickness of approximately 50 to 70 nm, or a thickness of approximately 60 nm. Optical path control layer (OPCL) 105, which emits light due to photoluminescence (PL), generates light, e.g., green light G, which is not generated by electronluminescence (EL) light emitting unit 102. Green light G is generated by absorbing part of light emitted by electronluminescence (EL) light emitting unit 102. For example, green light G may be generated by absorbing blue light B that has higher energy than red light R. In FIG. 2, since the separate optical path control layer (OPCL) 105 generates green light, strong cavity 106 as shown in FIG. 1 does not need to be formed between the first electrode 101a' and the second electrode 101b in the present embodiment. In order to form such a relatively weak cavity as shown in FIG. 2, transparent first electrode 101a' through which light is transmitted may be formed of indium tin oxide (ITO) or indium zinc oxide (IZO) having a transmittance of 90% or more.

Accordingly, since three color light, that is, blue light and red light generated due to electronluminescence (EL) and green light generated due to photoluminescence (PL), is output through OPCL 105, a white spectrum may be obtained by combining the blue light, the red light, and the green light.

When the transparent first electrode 101a of top emission type WOLED of FIG. 1 is formed of Al/Ag having a transmittance of approximately 70%, the transparent first electrode 101a cooperates with the reflective second electrode 101b disposed on substrate 100 to form a strong cavity. Accordingly, green light can be easily generated due to photoluminescence (PL) by controlling the thickness of the entire stacked structure, thereby optical path control layer (OPCL) 105 as shown in FIG. 2 is unnecessary in the embodiment as shown in FIG. 1. If a sufficient amount of green light is not generated with even a strong cavity, however, an OPCL may be used. As shown in FIG. 2, when the transparent first electrode 101a' is formed of ITO or IZO having a transmittance of higher than 90%, a weak cavity is formed. In order to compensate for the weak cavity, it is necessary to increase the photoluminescence (PL) intensity of OPCL 105. Desired color coordinates, e.g., color coordinates (0.31, 0.31), can be obtained by easily increasing the photoluminescence (PL) intensity of OPCL 105 according to appropriate design conditions.

Figure 3:
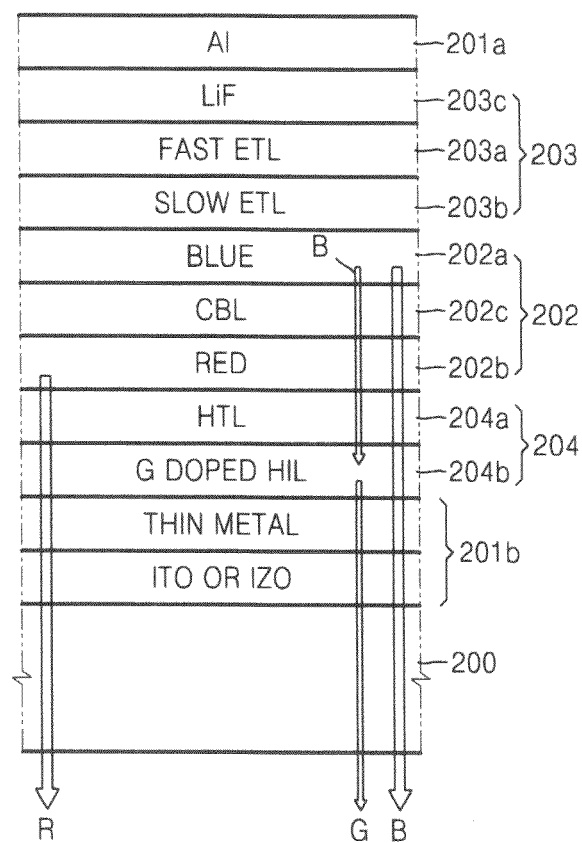
FIG. 3 is a cross-sectional schematic view of a WOLED constructed as another embodiment of the present invention.

FIG. 3 is a schematic cross-sectional view of a bottom emission type WOLED constructed as another embodiment of the present invention.

Referring to FIG. 3, a reflective first electrode 201a and a transparent second electrode 201b define an internal optical cavity. The second electrode 201b may have a transmittance of approximately 70% to 90%, to form a strong cavity or a weak cavity as described above. Accordingly, the second electrode 201b formed on a substrate 200 may include a metal thin film layer formed of Al, Ag, or Mg, a ITO layer, or an IZO layer, or may have a stacked structure including these layers. In FIG. 3, if green light is generated due to NEL with a strong cavity, photoluminescence (PL) does not need to be induced.

An electronluminescence (EL) light emitting unit 202, including a first light emitting layer 202a and a second light emitting layer 202b with both formed of an organic light emission material, is disposed inside of the cavity defined by the first electrode 201a and the second electrode 201b. The first light emitting layer 202a and the second light emitting layer 202b emit light of different wavelengths, and are formed of an organic phosphorescent or fluorescent material. For example, the first light emitting layer 202a may generate blue light, and the second light emitting layer 202b may generate red light, or vice versa. A charge balancing layer 202c for balancing charges of the first light emitting layer 202a and the second light emitting layer 202b is disposed between the first light emitting layer 202a and the second light emitting layer 202b, similarly to charge balancing layer 102c of the WOLED as shown in FIG. 1.

Charge balancing layers 102c of FIGS. 1 and 202c of FIG. 2 may be formed of an electron transport material or a hole transport material. Blue and red light emission zones of electronluminescence (EL) light emitting units 102 and 202 of FIGS. 1 and 2 are respectively formed on interfaces between the first light emitting layers 102a and 202a and charge balancing layers 102c and 202c and between the second light emitting layers 102b and 202b and HTLs 104a and 204a. Charge balancing layers 102c and 202c respectively control an entire spectrum by electrically controlling the number of electrons and holes between the first light emitting layers 102a and 202a and the second light emitting layers 102b and 202b.

Charge balancing layers 102c and 202c are optional, and accordingly, the first light emitting layers 102a and 202a and the second light emitting layers 102b and 202b may directly contact each other without charge balancing layers 102c and 202c therebetween.

The first and second functional layers 203 and 204 for injecting/transporting electrons and holes supplied from the first electrode 201a and the second electrode 201b are disposed on both sides of electronluminescence (EL) light emitting unit 202.

The first functional layer 203 may be an ETL, and may have a single-layer or multi-layer structure. When the first functional layer 203 has a multi-layer structure, the first functional layer 203 may include a fast ETL 203a and a slow ETL 203b. The first functional layer 203 may further include an EIL 203c formed of a well-known material such as LiF.

Since the first functional layer 203 includes fast electron transport layer (ETL) 203a and slow ETL 203b, electrons are accumulated on an interface between fast ETL 203a and slow ETL 203b according to a difference in the drift velocity of electrons between fast ETL 203a and slow ETL 203b, and thus holes can be effectively induced. The first functional layer 203 may further include an electron injection layer (EIL) 203c formed of a well-known material in addition to fast ETL 203a and slow ETL 203b.

The second functional layer 204 may include a hole transport layer (HTL) 204a and a hole injection layer (HIL) 204b. The second functional layer 204 injects and transports holes into electronluminescence (EL) light emitting unit 202. The function of the second functional layer 204 may be exchanged with that of the first functional layer 203.

The entire stacked structure may be formed on substrate 200. Since the first electrode 201a is a reflective layer, light emitted by electronluminescence (EL) light emitting unit 202, for example, blue light B and red light R inside the cavity, may partially pass through the second electrode 201b and may be output to the exterior.

The second functional layer 204 is doped with a photoluminescence (PL) material, for example, a green photoluminescence (PL) material. The green PL material may be doped into HIL 204b of the second functional layer 204, such that HIL 204b acts as a photoluminescence (PL) light emitting unit on a region where there are no combinations of electrons and holes. A green dopant of HIL 204b generates green light G by absorbing light emitted by EL light emitting unit 202, for example, blue light B that has higher energy than red light R. Green light G passes through the second electrode 201b and is output to the exterior.

Accordingly, since three color light, that is, blue light and the red light generated due to electronluminescence (EL) and green light generated due to photoluminescence (PL), is output through substrate 200, white light may be obtained by combining the blue light, the red light, and the green light.

Hence, the WOLED can reduce a color change caused by a voltage change and can effectively operate at a low voltage.

The main reason why a color change is caused by a voltage change is that exciton distribution of a green light emitting layer using the same host material as that of a blue light emitting layer is changed according to a voltage and is amplified according to the structure of an internal cavity. It is possible that the host material of the green light emitting layer is different from the host material of the blue light emitting layer. In this case, however, the number of used materials is increased, which is undesirable in terms of efficient process control for which the same host material should be used if possible.

In general, color coordinates of (0.31, 0.31) are required for display devices for mobile devices and color coordinates of (0.28, 0.29) are required for televisions. Here, green light accounts for a smaller percentage, e.g., about 17%, than red and blue light.

Electronluminescence (EL) light emitting unit 202 using combinations of electrons and holes does not include a green light emitting layer in order to reduce a color change due to a voltage change and reduce the electrical resistance of EL light emitting unit 202.

If the Electronluminescence (EL) light emitting unit includes red, blue, and green light emitting layers, almost half of a total resistance arises from a host material of the green light emitting layer, and thus 50% of a voltage applied to the stacked structure is assigned to the green light emitting layer. Accordingly, since a green light emitting layer is excluded from EL light emitting unit 202, a voltage applied to EL light emitting unit 202 may be reduced by approximately 1 V when compared with a conventional EL light emitting unit. Color light, i.e., green light, excluded from light emitted by the EL light emitting unit which is necessary to obtain desired white light, is obtained from the photoluminescence (PL) light emitting unit as described above. Desired color coordinates (0.31, 0.31) are obtained by adjusting blue and red spectrums from electronluminescence (EL) light emitting unit 202 and a green spectrum from the PL light emitting unit. The green spectrum is obtained from the doped PL light emitting unit by properly adjusting conditions for the cavity. In detail, a weak green zone may be obtained by properly adjusting the conditions for the cavity and expanding a blue light emission zone. The blue light emission zone may be expanded due to electrons accumulated in fast and slow ETLs 203a and 203b to improve luminous efficiency. Further, a green spectrum having an intensity high enough to obtain white light can be obtained through separate green photoluminescence (PL) emission.

Figure 4:
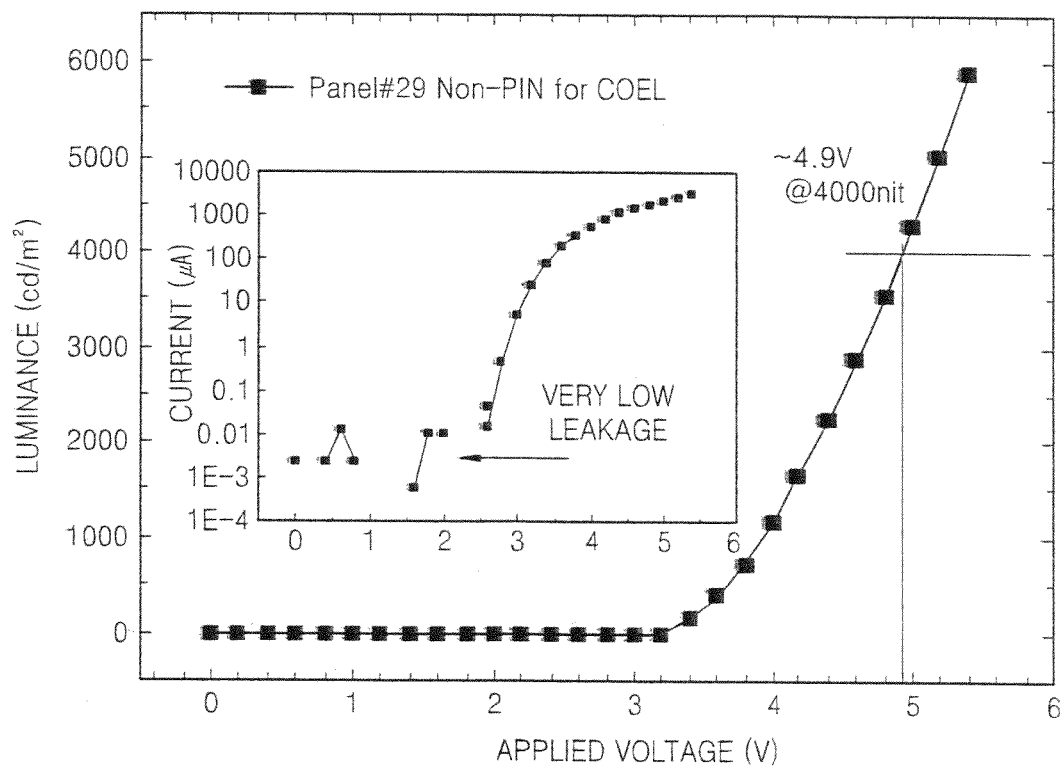
FIG. 4 is a two dimensional graph illustrating an experimental relationship between voltage and luminance in a WOLED constructed as an embodiment of the present invention.

FIG. 4 is a two dimensional graph illustrating an experimental relationship between applied voltage and luminance in a WOLED constructed as an embodiment of the present invention. Referring to FIG. 4, in order to have a luminance of 4000 nit (cd/m$^2$), the WOLED required a voltage of approximately 4.9 V, which is about 1V less than approximately 6V required by a conventional WOLED.

Figure 5:
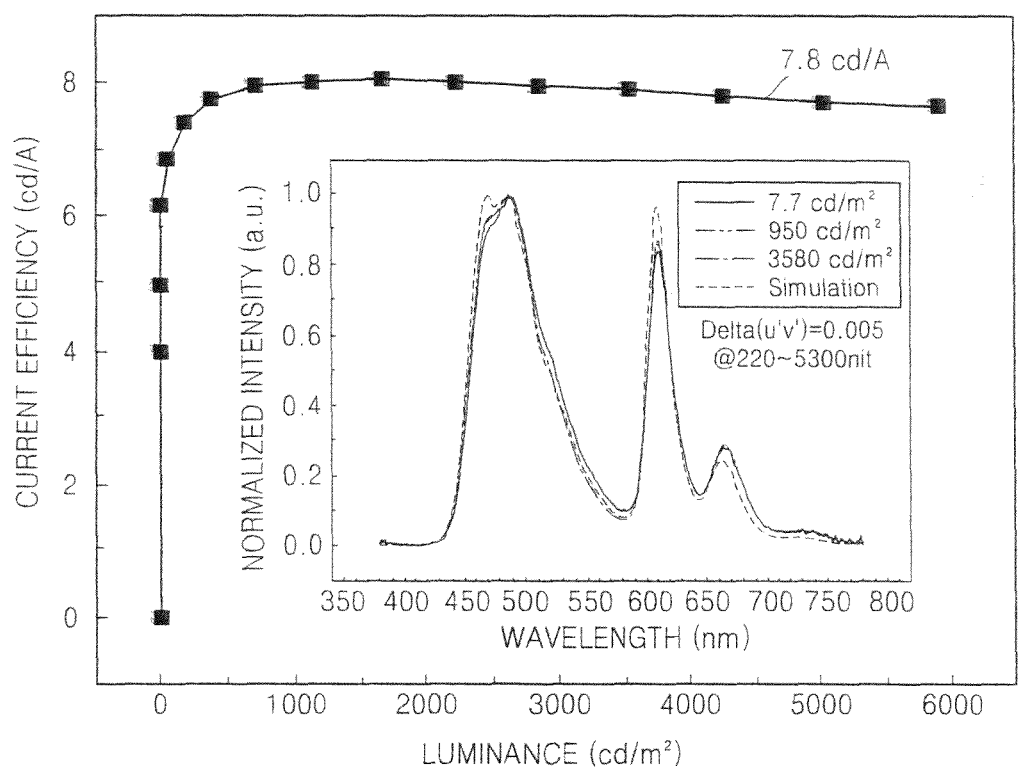
FIG. 5 is a two dimensional graph illustrating an experimental relationship between luminance and current in a WOLED constructed as an embodiment of the present invention.

FIG. 5 is a two dimensional graph illustrating an experimental relationship between luminance and current efficiency in a WOLED constructed as an embodiment of the present invention. Referring to FIG. 5, when a luminance was 400-4000 nit (candela/m2, i.e., cd/m2), a color change $\Delta(u'v')$ was 0.003 which is about 6 times less than 0.02 that is conventionally obtained. When a luminance was 220~5300 nit wider than 400~4000 nit, a change voltage was 0.005 and color coordinates were (0.29, 0.29). When a luminance was 4000 nit, a driving voltage was 4.9 V, which is about 1 V less than 6 V that is conventionally obtained. When it comes to efficiency, a maximum efficiency obtained by a top emission type WOLED constructed as an embodiment of the present invention by increasing the amount of current was 7.8 cd/A, which is sufficiently better than 8.7 cd/A of a conventional WOLED.

Figure 6:
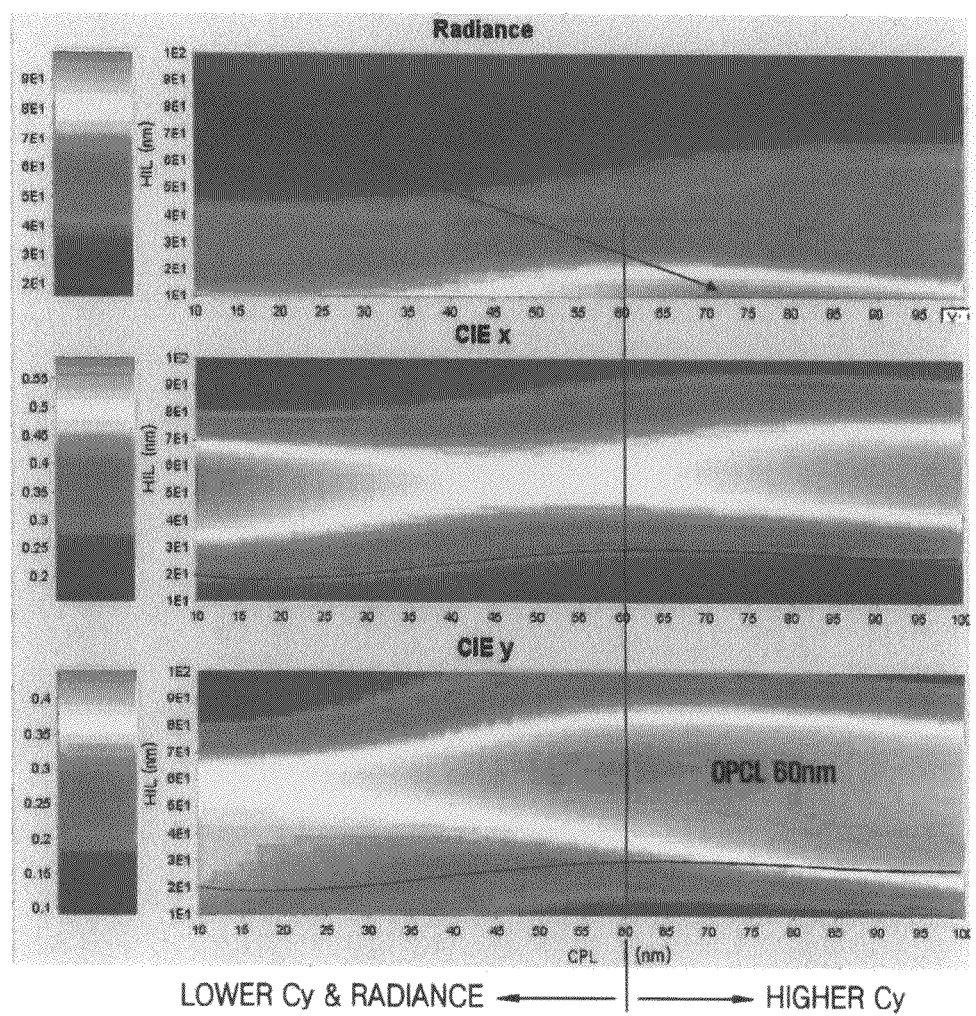
FIG. 6 is a drawing in color and illustrates a group of two dimensional graphs illustrating simulated results of color coordinates when the thickness of an optical path control layer (OPCL) of a WOLED is changed according to an embodiment of the present invention, and different colors represents different values of color coordinates.
Figure 7:
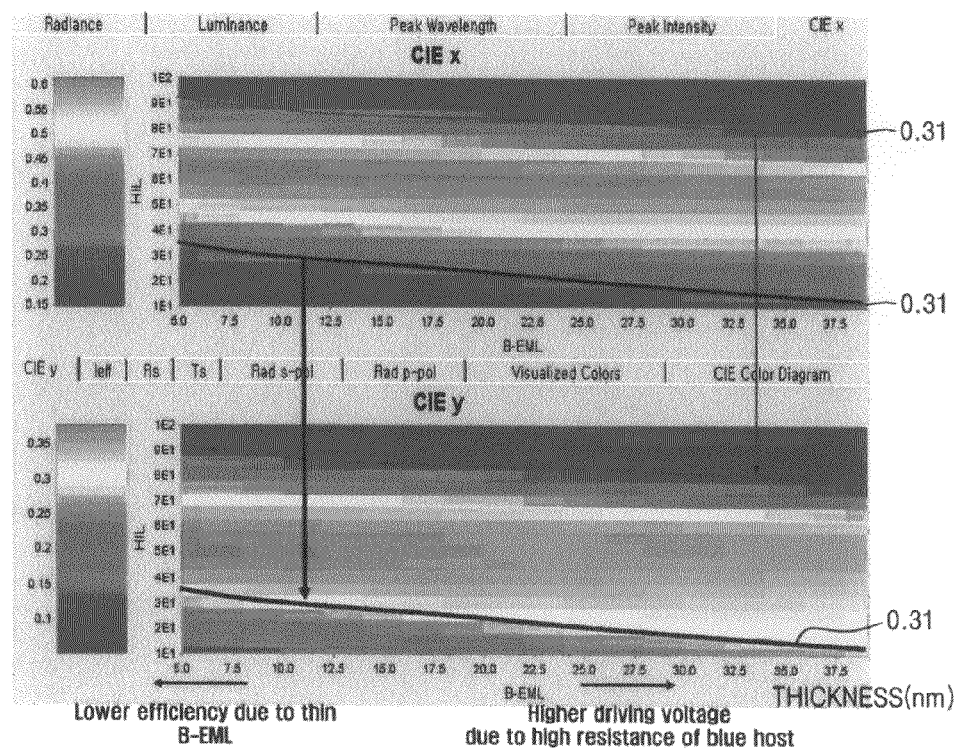
FIG. 7 is a drawing in color and illustrates a group of two dimensional graphs illustrating simulated results of color coordinates when the thickness of the OPCL of the WOLED is fixed to 60 nm according to an embodiment of the present invention, and different colors represents different values of color coordinates.

FIGS. 6 and 7 illustrate simulation results of a top emission WOLED constructed as an embodiment of the present invention. In FIGS. 6 and 7, a left spectrum column is a legend in which values of CIEx and CIEy are represented as chromaticity.

Referring to FIG. 6 illustrating color coordinates versus the thickness of an hole injection layer (HIL) and an optical path control layer (OPCL), when the thickness of the OPCL is greater than 60 nm, the value of CIEy is averagely greater than 0.31, and when the thickness of the OPCL is less than 60 nm, the value of CIEy is averagely less than 0.31 and luminance is reduced. Accordingly, OPCL 105 of the top emission type WOLED of FIG. 2 has a thickness of approximately 60 nm.

In FIG. 7, the value of CIEx being 0.31 is marked by thick and thin solid lines. In other words, the value of CIEx remains 0.31 along these two solid lines. It can be seen from color coordinates changed according to the thickness of a blue light emitting layer and an HIL that, when two solid lines indicating the value CIEx of 0.31 are mapped to chromaticity CIEy, if the thickness of the blue light emitting layer (B-EML) is greater than 15 nm, the desired color coordinates can be obtained, but an increase of the thickness of the blue light emitting layer using the same host material as that of a green light emitting layer induces the increase of the driving voltage; and if the thickness of the blue light emitting layer is less than 5 nm, blue light emission efficiency may be reduced. Accordingly, it is preferable that the blue light emitting layer have a thickness of approximately 10 nm. Even when the HIL has a thickness of approximately 80 nm, the desired CIEx marked by the thin solid line in FIG. 7 can be obtained but CIEy is reduced.

Accordingly, since the WOLED constructed as the present embodiment can minimize a color change which is a problem in a conventional stack type WOLED, and can ensure low voltage and high efficiency, the WOLED can be used for display devices and illumination devices. Also, since the number of light emitting layers is reduced by one, the WOLED is preferable in terms of process control.

In FIGS. 1 and 2, the first light emitting layers 102a and 202a and the second light emitting layers 102b and 202b include an organic fluorescent or phosphorescent material.

Materials of the stacked structures of FIGS. 1 and 2 are commonly used materials as follows.

A transparent material used for the first electrodes 101a and 201a or the second electrodes 101b and 202b may be ITO, IZO, tin oxide ($SnO_2$), or zinc oxide (ZnO). A reflective material used for the first electrodes 101a and 201a or the second electrodes 101b and 202b may be lithium (Li), magnesium (Mg), aluminum (Al), aluminum-lithium (Al—Li), calcium (Ca), magnesium-indium (Mg—In), or magnesium-silver (Mg—Ag).

A material used for HILs 104b and 204b may be a well-known material, for example, a phthalocyanine compound such as copper phthalocyanine, a starburst type amine derivative such as TCTA, m-MTDATA, m-MTDAPB, or $MoO_3$, a soluble conductive polymer such as Pani/DBSA(Polyaniline/Dodecylbenzenesulfonic acid), or PEDOT/PSS(Poly(3,4-ethylenedioxythiophene)/Poly(4-styrenesulfonate), Pani/CSA(Polyaniline/Camphor sulfonicacid), or PANI/PSS (Polyaniline)/Poly(4-styrenesulfonate).

HILs 104b and 204b may have a thickness of approximately 100 Å to 10000 Å, and preferably 100 Å to 1000 Å. When the thickness of HILs 104b and 204b is less than 100 Å, hole injection characteristics may be degraded. When the thickness of HILs 104a and 204b is greater than 10000 Å, a driving voltage may be increased.

A material used for HTLs 104a and 204a may be a well-known hole transport material, for example, an amine derivative having an aromatic condensed ring such as a carbazole derivative such as N-phenylcarbazole or polyvinylcarbazole, N,N'-Bis(3-methylphenyl)-N,N'-diphenyl-[1,1-biphenyl]-4,4'-diamine(TPD), or N,N'-Di(naphthalene-1-yl)-N,N'-diphenyl benzidine(α-NPD).

HTLs 104a and 204a may have a thickness of approximately 50 Å to 1000 Å, and preferably 100 Å to 600 Å. When the thickness of HTLs 104a and 204a is less than 50 Å, hole transport characteristics may be degraded. When the thickness of HTLs 104a and 204a is greater than 1000 Å, a driving voltage may be increased.

A material used for ETLs 103a, 103b, 203a, and 203b which can stably transport electrons injected from a cathode may be a well-known material such as an oxazole-based compound, an isoxazole-based compound, a triazole-based compound, an isothiazole-based compound, an oxadiazole-based compound, a thiadiazole-based compound, a perylene-based compound, an aluminum complex such as Alq3(tris(8-quinolinolato)-aluminium) Balq, SAlq, or Almq3, or a gallium complex such as Gaq'2OPiv, Gaq'2OAc, 2(Gaq'2).

A material used for EILs 103c and 203c is not limited to a specific material if the material can easily inject electrons from a cathode. The material used for EILs 103c and 203c may be a well-known material such as LiF, NaCl, CsF, $Li_2O$, BaO, $BaF_2$, or a mixture of $CsCO_3$ and BCP. Conditions for depositing EILs 103c and 203c may be different according to used compounds, but may be nearly the same as conditions for forming the HIL.

A phosphorescent dopant included in OPCL 105 and HIL 204b acting as the PL light emitting layers emitting green light is not limited to a specific dopant. A green dopant may be [Coumarin 6] or Ir(PPy)$_3$(PPy=2-phenylpyridine). A red dopant may be [4-(dicyanomethylene)-2-t-butyl-6-(1,1,7,7-tetramethyljulolidyl-9-enyl)-4H-pyran (4-(dicyanomethylene)-2-t-butyl-6-(1,1,7,7-tetramethyljulolidyl-9-enyl)-4H-pyran; DCJTB)], PtOEP, RD 61 of UDC corporation, RD15, or TER021 of Merck corporation. Other well-known PL materials for emitting green light may be used.

A blue dopant used for blue light emitting layers 102a and 202a of EL light emitting units 102 and 202 emitting blue light is not limited to a specific dopant, and may be DPAVBi, a DPAVBi derivative, distyrylarylene (DSA), a DSA derivative, distyrylbenzene (DSB), a DSB derivative, spiro-DPVBi, or spiro-6P(spiro-sexyphenyl). A red dopant used for red light emitting layers 102b and 202b of EL light emitting units 102 and 202 is not limited to a specific dopant, and may be 4-(dicyanomethylene)-2-t-butyl-6-(1,1,7,7-tetramethyljulolidyl-9-enyl)-4H-pyran(4-(dicyanomethylene)-2-t-butyl-6-(1,1,7,7-tetramethyljulolidyl-9-enyl)-4H-pyran; DCJTB), PtOEP, or RD 61 of UDC corporation. A green dopant used for OPCL 105 and HIL 204b acting as the PL light emitting layers emitting green light is not limited to a specific dopant, and may be coumarin or Ir(PPy)3(PPy=2-phenylpyridine).

A red phosphorescent material used for EL light emitting units 102 and 202 may be any one selected from the group consisting of Tris(dibenzoylmethane)phenanthroline europium(III), Bis(2-benzo[b]thiophen-2-yl-pyridine) (acetylacetonate)iridium(III), Tris(1-phenylosoquinoline)iridium(III), Bis(1-phenylisoquinoline)(acetylacetonate) iridium(III), Bis([1-(9,9-dimethyl-9H-fluoren-2-yl)-isoquinoline] (acetylacetonate)iridium(III), Bis[3-(9,9-dimethyl-9H-fluoren-2-yl)-isoquinoline](acetylacetonate) iridium(III), Tris[4,4'-di-tert-butyl-(2,2')-bipyridine] ruthenium(III) complex, and Tris(2-phenylquinoline)iridium (III).

A red fluorescent material may be any one selected from the group consisting of 4-(Dicyanomethylene)-2-tert-butyl-6-(1,1,7,7-tetramethyljulolidin-4-yl-vinyl)-4H-pyran, and Tetraphenylnaphthancene, Bis(2-phenylquinoline) (acetylacetonate)iridium(III).

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A white organic light emitting device (WOLED), comprising:
    first and second electrodes disposed spaced-apart from and opposite to each other;
    an electroluminescence (EL) light emitting unit disposed between the first and second electrodes, the EL light emitting unit comprising a first light emitting layer and a second light emitting layer which emit light using combinations of electrons and holes; and
    a non-electroluminescence (NEL) light emitting unit disposed between the first and second electrodes, the NEL light emitting unit generating a third light having a wavelength different from those of light emitted by the first light emitting layer and the second light emitting layer by using light emitted by the EL light emitting unit,
    with the first electrode and the second electrode defining an optical cavity in which the EL light emitting unit is disposed, and with the NEL light emitting unit generating the third light by using a resonance structure between the first electrode and the second electrode.

2. The WOLED of claim 1, with the NEL light emitting unit further comprising a photoluminescence (PL) light emitting unit that is disposed on a path through which light output from the EL light emitting unit travels, and adapted to absorb part of the light output from the EL light emitting unit and to emit the third light.

3. The WOLED of claim 2, further comprising functional layers disposed on both sides of the EL light emitting unit and injecting and transporting electrons and holes supplied from the first electrode and the second electrode.

4. The WOLED of claim 1, with the first and second light emitting layers respectively emitting a blue light and a red light, and the NEL light emitting unit generating a green light.

5. The WOLED of claim 2, with the PL light emitting unit disposed on the path through which light output from the EL light emitting unit travels being disposed outside the cavity.

6. The WOLED of claim 2, with the EL light emitting unit and the PL light emitting unit being disposed inside of the cavity, and with the PL light emitting unit being disposed on a portion of the path through which light output from the EL light emitting unit travels where there are no combinations of electrons and holes.

7. The WOLED of claim 6, further comprising functional layers disposed on both sides of the EL light emitting unit, doped with a PL material on the path through which light output from the EL light emitting unit travels, and injecting and transporting electrons and holes supplied from the first electrode and the second electrode.

8. The WOLED of claim 6, with the functional layers comprising at least one selected from the group consisting of a hole injection layer, a hole transport layer, an electron injection layer, an electron transport layer, a hole blocking layer, and an electron blocking layer.

9. The WOLED of claim 8, with the hole transport layer comprising a fast hole transport layer and a slow hole transport layer.

10. The WOLED of claim 7, with the functional layers comprising at least one selected from the group consisting of a hole injection layer, a hole transport layer, an electron injection layer, an electron transport layer, a hole blocking layer, and an electron blocking layer.

11. The WOLED of claim 10, with the electron transport layer comprising a fast electron transport layer and a slow electron transport layer.

12. The WOLED of claim 1, further comprising a charge balancing layer disposed between the first light emitting layer and the second light emitting layer.

13. A white organic light emitting device (WOLED), comprising:
    first and second electrodes disposed spaced-apart from and opposite to each other;
    an electroluminescence (EL) light emitting unit disposed between the first and second electrodes, the EL light emitting unit comprising a first light emitting layer and a second light emitting layer which emit light by using combinations of electrons and holes; and
    a non-electroluminescence (NEL) light emitting unit disposed between the first and second electrodes, the NEL light emitting unit generating a third light having a wavelength different from those of light emitted by the first light emitting layer and the second light emitting layer by using light emitted by the EL light emitting unit, with a white spectrum being obtained by combining the light emitted by the EL light emitting unit and the third light generated by the non-electroluminescence NEL light emitting unit;
    with the first electrode and the second electrode defining an optical cavity in which the EL light emitting unit is disposed, and with the NEL light emitting unit generating the third light by using a resonance structure between the first electrode and the second electrode.

* * * * *

UNITED STATES PATENT AND TRADEMARK OFFICE
CERTIFICATE OF CORRECTION

| | | |
|---|---|---|
| PATENT NO. | : 8,552,639 B2 | Page 1 of 1 |
| APPLICATION NO. | : 12/292848 | |
| DATED | : October 8, 2013 | |
| INVENTOR(S) | : Mu-gyeom Kim et al. | |

It is certified that error appears in the above-identified patent and that said Letters Patent is hereby corrected as shown below:

On the Title Page, Item (75)

The spelling of the third listed inventor is to be corrected to Sung-hun Lee instead of Sun-hoon Lee.

Signed and Sealed this
Twenty-sixth Day of August, 2014

Michelle K. Lee
*Deputy Director of the United States Patent and Trademark Office*